United States Patent
Wu et al.

(10) Patent No.: US 12,543,432 B2
(45) Date of Patent: Feb. 3, 2026

(54) DISPLAY PANEL, AND DISPLAY DEVICE INCLUDING BARRIER WALL AND CRACK BLOCKING STRUCTURE

(71) Applicants: Mianyang BOE Optoelectronics Technology Co., Ltd., Sichuan (CN); BOE Technology Group Co., Ltd., Beijing (CN)

(72) Inventors: Yongkai Wu, Beijing (CN); Zhengping Xiong, Beijing (CN); Yunzhi Wang, Beijing (CN); Haoyuan Fan, Beijing (CN); Bo Zhang, Beijing (CN); Jinyu Chao, Beijing (CN); Shuaimin Jian, Beijing (CN); Yixiang Yang, Beijing (CN); Gaoyun Wang, Beijing (CN); Chao Liu, Beijing (CN)

(73) Assignees: Mianyang BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 421 days.

(21) Appl. No.: 18/025,062

(22) PCT Filed: May 31, 2022

(86) PCT No.: PCT/CN2022/096185
§ 371 (c)(1),
(2) Date: Mar. 7, 2023

(87) PCT Pub. No.: WO2023/230822
PCT Pub. Date: Dec. 7, 2023

(65) Prior Publication Data
US 2024/0284702 A1    Aug. 22, 2024

(51) Int. Cl.
*H10K 50/84*    (2023.01)
*H10K 50/842*   (2023.01)
(Continued)

(52) U.S. Cl.
CPC ......... *H10K 50/8423* (2023.02); *H10K 59/40* (2023.02); *H10K 59/873* (2023.02); *H10K 2102/311* (2023.02)

(58) Field of Classification Search
CPC .. H10K 50/8423; H10K 50/844; H10K 50/80; H10K 59/40; H10K 59/873
See application file for complete search history.

(56) References Cited

U.S. PATENT DOCUMENTS 11,527,738 B2 * 12/2022 Zhang ................. H10K 59/131
11,678,524 B2 *  6/2023 Zhao .................. H10K 59/8731
                                                               257/40
(Continued)

FOREIGN PATENT DOCUMENTS

CN    108364987 A  *  8/2018  ......... H10K 59/8731
CN    106653818 B  * 11/2019  ........... H01L 23/562
(Continued)

*Primary Examiner* — Ida M Soward
(74) *Attorney, Agent, or Firm* — IPro, PLLC

(57) ABSTRACT

The display panel includes an opening region, a barrier region surrounding the opening region, a display region surrounding the barrier region, a base substrate, a crack blocking structure surrounding the opening region; a barrier wall surrounding the crack blocking structure. The barrier wall and the crack blocking structure include a first metal layer and a first organic layer, an edge of side of the first metal layer away from the base substrate is indented relative to an edge of side of the first organic layer proximal to the base substrate. The barrier wall and the crack blocking structure includes a deep groove penetrating through a film layer between the first organic layer and the base substrate, the deep groove surrounds the opening region. The first organic layer fills the deep groove and is connected to the base substrate.

17 Claims, 8 Drawing Sheets

(51) Int. Cl.
    *H10K 59/40*     (2023.01)
    *H10K 59/80*     (2023.01)
    *H10K 102/00*    (2023.01)

(56) References Cited

U.S. PATENT DOCUMENTS

| | | | | |
|---|---|---|---|---|
| 2020/0280021 | A1* | 9/2020 | Li | H10K 59/124 |
| 2022/0407032 | A1* | 12/2022 | Guo | H10K 71/00 |
| 2023/0049125 | A1* | 2/2023 | Bai | H10K 50/844 |

FOREIGN PATENT DOCUMENTS

| | | | | | |
|---|---|---|---|---|---|
| CN | 108364987 | B | * | 1/2021 | H10K 59/8731 |
| CN | 113594387 | A | * | 11/2021 | H10K 59/40 |
| KR | 20170115177 | A | * | 10/2017 | H01L 27/3265 |
| KR | 20200047941 | A | * | 5/2020 | H01L 51/56 |
| KR | 20220033611 | A | * | 3/2022 | H10K 59/873 |

\* cited by examiner

DISPLAY PANEL, AND DISPLAY DEVICE INCLUDING BARRIER WALL AND CRACK BLOCKING STRUCTURE

CROSS-REFERENCE TO RELATED APPLICATIONS

This application is a National Stage of International Application No. PCT/CN2022/096185, filed May 31, 2022, which is hereby incorporated by reference in its entirety.

FIELD

The present disclosure relates to the technical field of display, and particularly relates to a display panel, a display module, and a display device.

BACKGROUND

In full screen products, a hole-punch design is generally made in a display region for placement of a camera module.

However, in Organic Light Emitting Diode (OLED) display screens, since the inorganic layer in an encapsulation layer is designed to be continuous in an external control peripheral region, this hole-punch mode in the display region may easily lead to the peeling or cracking of an inorganic layer, which may extend to the peripheral display region when the region around a punched hole is encapsulated, resulting in the presence of black spots around the hole.

SUMMARY

In a first aspect, an embodiment of the present disclosure provides a display panel provided with an opening region, a barrier region surrounding the opening region, and a display region surrounding the barrier region. The display panel includes: a base substrate: a crack blocking structure, being located on a side of the base substrate in the barrier region and surrounding the opening region; and a barrier wall, being located on a side of the base substrate in the barrier region and surrounding the crack blocking structure.

The barrier wall and the crack blocking structure respectively include a first metal layer and a first organic layer on a side of the first metal layer away from the base substrate, wherein an edge of the side of the first metal layer away from the base substrate is indented relative to an edge of a side of the first organic layer proximal to the base substrate. At least one of the barrier wall and the crack blocking structure is provided with a deep groove penetrating through a film layer between the first organic layer and the base substrate, and the deep groove surrounds the opening region. The first organic layer fills the deep groove and is connected to the base substrate.

In a possible embodiment, the barrier region further includes a support structure that is located in the barrier region and surrounds the opening region, wherein the crack blocking structure surrounds the support structure.

The support structure includes the first organic layer, and a film layer between the first organic layer and the base substrate.

In a direction from the opening region to the display region, the support structure is provided with a plurality of deep grooves at intervals, and the first organic layer is connected to the base substrate by the deep grooves.

In a possible embodiment, the deep groove surrounding the support structure is formed in a region between the support structure and the crack blocking structure. The first organic layer in the support structure fills the deep groove between the support structure and the crack blocking structure and is connected to the base substrate.

In a possible embodiment, the display panel further includes: a plurality of second metal layers and inorganic layers, being alternately stacked between the base substrate and the first metal layer at the barrier region.

The deep groove penetrates through the film layer between the first organic layer and the base substrate.

In a possible embodiment, the first organic layer located in the barrier wall includes a first sub-organic layer and a second sub-organic layer arranged in stack.

First organic layers located in the crack blocking structure and the support structure respectively include a first sub-organic layer.

The first sub-organic layer is connected to the base substrate by the deep groove.

In a possible embodiment, a longitudinal section of the first sub-organic layer is in a shape of a spur rack, one tooth in the spur rack corresponding to one deep groove.

In a possible embodiment, a plurality of the deep grooves are formed in the barrier wall.

In a possible embodiment, the deep groove includes a groove wall and a groove bottom, wherein the groove wall is composed of a film layer extending between the first sub-organic layer and the base substrate and at least one film layer in the base substrate, and the groove bottom is located at a film layer in the at least one film layer furthest from the first metal layer.

In a possible embodiment, the film layer on which the groove bottom is located employs the same material as the first sub-organic layer.

In a possible embodiment, the first metal layer includes a first sub-metal layer, a second sub-metal layer, and a third sub-metal layer. The first sub-metal layer is located on a side of the first organic layer proximal to the base substrate. The second sub-metal layer is located on a side of the first sub-metal layer away from the base substrate. The third sub-metal layer is located on a side of the second sub-metal layer away from the base substrate.

Longitudinal sections of the first sub-metal layer, the second sub-metal layer, and the third sub-metal layer are patterned as trapezoids.

In the barrier wall and the crack blocking structure, edges of the second sub-metal layer are indented relative to edges of the first sub-metal layer and the third sub-metal layer.

In a possible embodiment, the display panel further includes an encapsulation layer covering the display region and the barrier region. The encapsulation layer includes a first inorganic encapsulation layer, an organic encapsulation layer, and a second inorganic encapsulation layer. The first inorganic encapsulation layer is located on a side of the first organic layer away from the base substrate. The organic encapsulation layer is located on a side of the first inorganic encapsulation layer away from the base substrate. The second inorganic encapsulation layer is located on a side of the organic encapsulation layer away from the base substrate.

The first inorganic encapsulation layer and the second inorganic encapsulation layer extend from the display region to the opening region, and the organic encapsulation layer is blocked by the barrier wall.

In a possible embodiment, the barrier region further includes a metal light-shielding layer that surrounds the barrier wall, and is located on a side surface of the encapsulation layer away from the base substrate.

The display panel further includes: a touch inorganic layer, covering the display region and a non-display region and being located on a side of the metal light-shielding layer away from the base substrate; and a touch protective layer, covering the touch inorganic layer, at least a part of the touch protective layer in the barrier region being prepared from a mixed solution composed of graphene and a nonpolar solvent, and being electrically connected to a ground potential.

In a possible embodiment, the touch inorganic layer is provided with an open slot surrounding the barrier wall and penetrating through the touch inorganic layer, and the touch protective layer fills the open slot.

A binding region is arranged on a side of the display region, and the display panel further includes a metal lead electrically connecting the metal light-shielding layer to a ground terminal in the binding region.

In a possible embodiment, the nonpolar solvent includes: an acrylate solvent or an epoxy resin solvent.

In a possible embodiment, a black substance is doped in a mixed solution used in at least a part of the touch protective layer in the barrier region.

In a possible embodiment, the black substance includes: graphene powder or black pigment.

In a second aspect, an embodiment of the present disclosure provides a display module, including: the display panel in the first aspect; and a flexible circuit board, being bonded with the binding region in the display panel.

In a third aspect, an embodiment of the present disclosure provides a display device including: the display module in the second aspect.

DETAILED DESCRIPTION OF THE EMBODIMENTS

Figure 1:
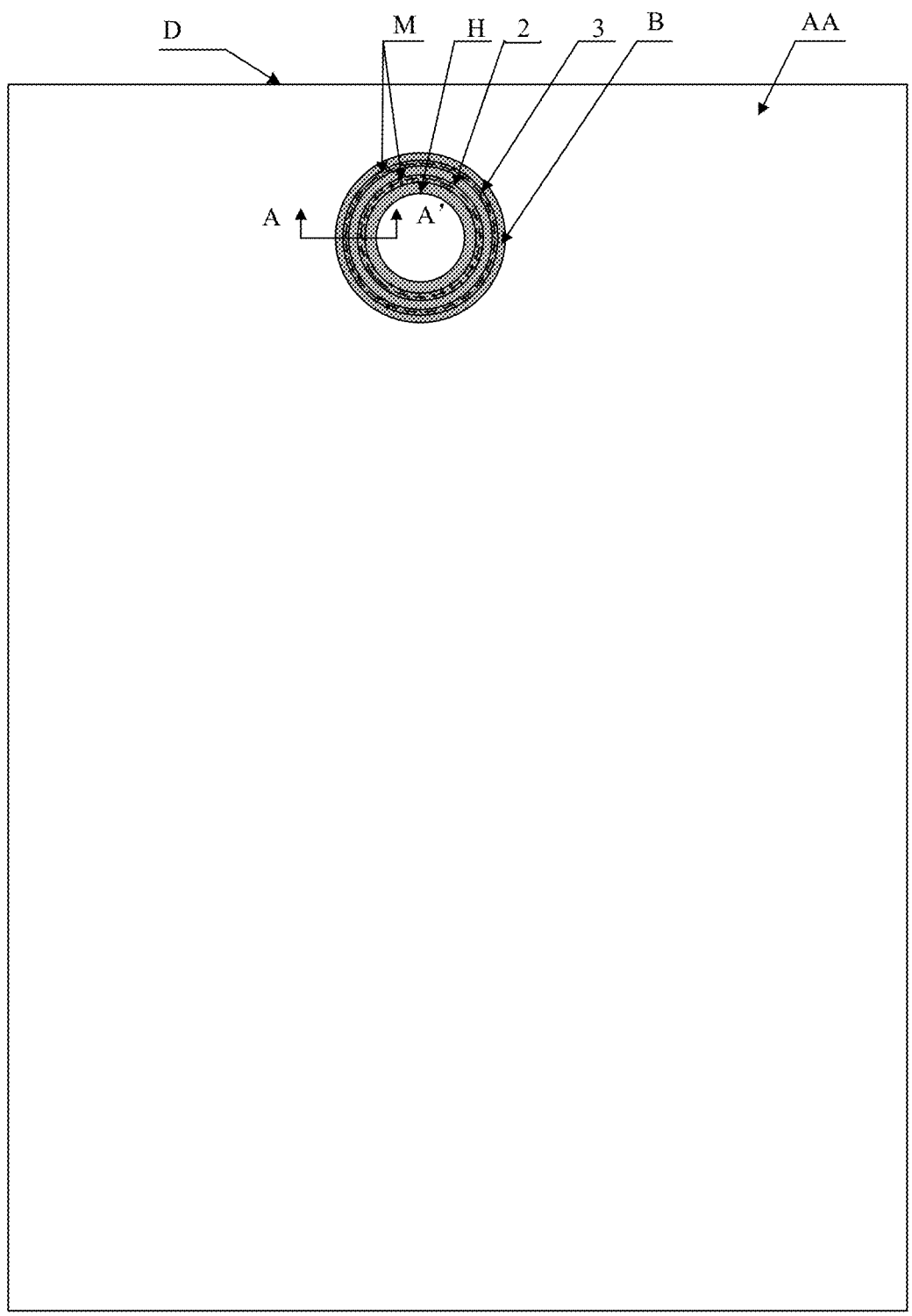
FIG. 1 shows a top view of a display panel according to an embodiment of the present disclosure.

Embodiments of the present disclosure provide a display panel, a display module, and a display device to solve the above problems.

In order that the above objectives, features and advantages of the present disclosure can be more readily understood, the present disclosure will now be further described with reference to the accompanying drawings and embodiments. However, exemplary embodiments may be implemented in various forms, and it should not be construed as being limited to the embodiments set forth herein. On the contrary, these embodiments are provided such that the present disclosure will be thorough and complete, and will fully convey the concept of the exemplary embodiments to those skilled in the art. The same reference numerals denote the same or similar structures in the drawings, and thus repeated description thereof will be omitted. Words expressing positions and directions described in the present disclosure are illustrated by taking the accompanying drawings as an example, but variations can be made as desired, and the variations are within the scope of the present disclosure. The drawings of the present disclosure are only used to illustrate that relative positional relationships do not represent true scale.

It should be noted that specific details are set forth in the following description in order to provide a thorough understanding of the present disclosure. However, the present disclosure can be implemented in other ways other than those described herein, and those skilled in the art can make similar extensions without violating the connotation of the present disclosure. Therefore, the present disclosure is not limited by the specific embodiments disclosed below: The follow-up description of the specification is about preferred embodiments for implementing the present application, and the description is still intended to explain the general principle of the present application, rather than limiting the scope of the present application. The protection scope of the present disclosure is defined by the appended claims.

Figure 2:
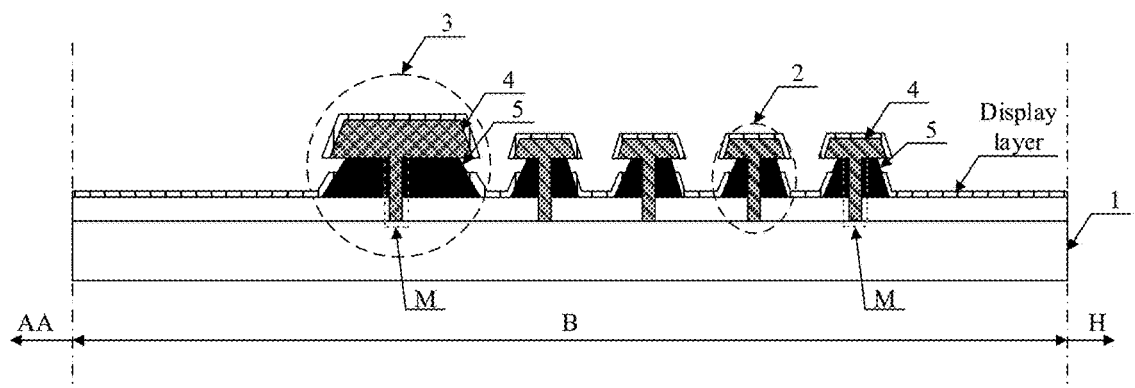
FIG. 2 shows a section view in a direction AA' of FIG. 1 according to an embodiment of the present disclosure.

Referring to FIG. 1 and FIG. 2. FIG. 1 is a top view of a display panel according to an embodiment of the present disclosure, and FIG. 2 is a section view in a direction AA' in FIG. 1 according to an embodiment of the present disclosure, wherein the display panel is provided with a opening region, a barrier region surrounding the opening region, and a display region surrounding the barrier region. The display panel includes:

a base substrate 1;
a crack blocking structure 2, being located on a side of the base substrate 1 in a barrier region B and surrounding an opening region H; and
a barrier wall 3, being located on a side of the base substrate 1 in the barrier region B and surrounding the crack blocking structure 2.

The barrier wall 3 and the crack blocking structure 2 respectively include a first metal layer 5 and a first organic layer 4 on a side of the first metal layer 5 away from the base substrate 1, wherein an edge of the side of the first metal layer 5 away from the base substrate 1 is indented relative to a lower edge of a side of the first organic layer 4 proximal to the base substrate 1. At least one of the barrier wall 3 and the crack blocking structure 2 is provided with a deep groove M penetrating through a film layer between the first organic layer 4 and the base substrate 1, and the deep groove M surrounds the opening region H. The first organic layer 4 fills the deep groove M and connected to the base substrate 1.

In some embodiments, the deep-digging groove M may be present only in the barrier wall 3, or only in the crack blocking structure 2, or also in both the barrier wall 3 and the crack blocking structure 2.

In the display panel, a display layer forming an electroluminescent device is arranged generally, and includes a cathode and an anode which are oppositely arranged, and a light-emitting layer located between the cathode and the anode. The display layer covers a display region AA and the barrier region B, and the display layer is deposited on the first organic layer 4 in the barrier region B (as shown in FIG. 2). The display layer deposited on each of the barrier wall 3 and the crack blocking structure 2 cracks between the first organic layer 4 and the first metal layer 5 since the upper edge of the first metal layer 5 in each of the barrier wall 3 and the crack blocking structure 2 indents relative to the lower edge of the first organic layer 4. Whereas since at least one of the barrier wall 3 and the crack blocking structure 2 is provided with the deep groove M penetrating through the film layer between the first organic layer 4 and the base substrate 1, the film layer cracks between the first organic layer 4 and the base substrate 1. Meanwhile, the first organic layer 4 filled in the deep groove M has good insulation and toughness, not only improves the strength and robustness of the barrier wall 3 and the crack blocking structure 2, and also enables the cathodes in the display layers at two ends of each of the barrier wall 3 and the crack blocking structure 2 not to be in electrical connection, so that the cathode potential in the display region AA cannot be transferred to the edge of the opening region H. and thus, when the edge of the opening region H is cut to form the opening region H, there are no problems such as "black spots" and "greenish at low gray level" at the edge of the opening region H caused by electrochemical erosion of the edge of the opening region H due to environmental temperature and humidity effects in the related art even if cracks are produced at the edge of the opening region H.

In some embodiments, there may be a plurality of crack blocking structures 2 in the barrier region B (as shown in FIG. 2). When there are a plurality of crack blocking structures 2 in the barrier region B, it can that one of the crack blocking structures 2 is provided with a deep groove M, it can also be that some of the crack blocking structures 2 are provided with deep grooves M. or it can further be that each of the crack blocking structures 2 is provided with a deep groove M.

As shown in FIG. 2, a plurality of crack blocking structures 2 are arranged in the barrier region B, deep grooves M penetrating through the film layer between the first organic layer 4 and the base substrate 1 are respectively formed in each crack blocking structure 2 and the barrier wall 3. In this way, each crack blocking structure 2 and the barrier wall 3 can be firmly attached to the base substrate 1 when the first organic layer 4 is deposited on the first metal layer 5, preventing an inorganic layer 8 of a display face from peeling off or from cracking caused by cutting the edge where the opening region H is formed.

Figure 3:
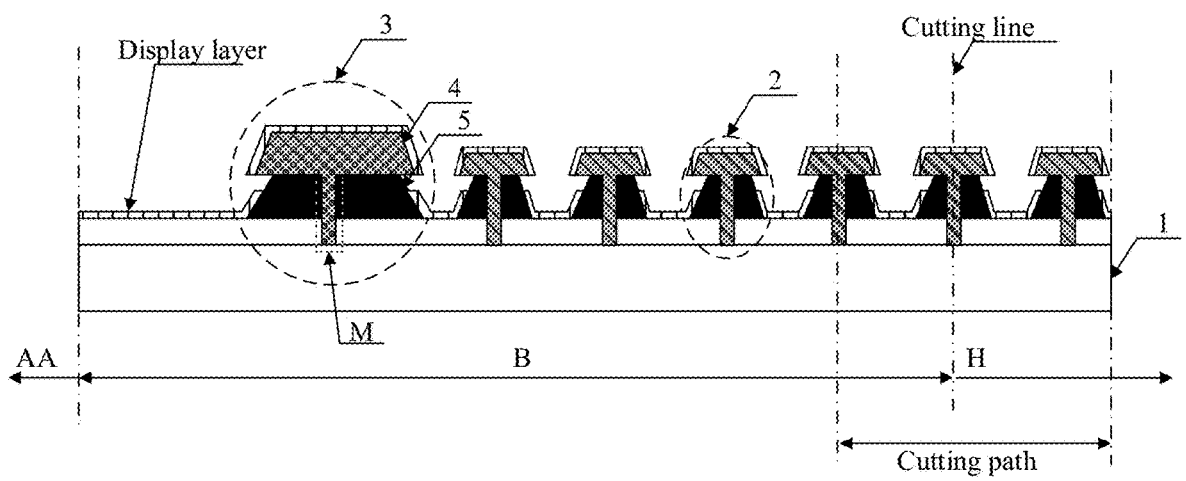
FIG. 3 shows a longitudinal section view of a barrier region before cutting of an opening region in a display panel according to an embodiment of the present disclosure.

FIG. 3 is a longitudinal section view of a barrier region before cutting of a opening region in a display panel according to an embodiment of the present disclosure. A plurality of crack blocking structures 2 in the barrier region B may be arranged towards the center of the opening region, and arranged in the opening region. FIG. 3 further shows an edge of an opening region H, which is usually referred to as a cutting line around the center of the opening region H, wherein an annular region centered on the cutting line may be referred to as a cutting path. Ideally, cutting is performed along the cutting line, but a corresponding region in an error allowable range is the region corresponding to the cutting path due to unavoidable errors caused by problems of alignment accuracy, equipment progress or the like. Since the crack blocking structures 2 which are filled with the first organic layers 4 to increase the strength thereof are arranged in the cutting path, the compression resistance and impact resistance of the periphery of the opening region can be improved, the mechanical strength can be improved, and the quantity of cracks produced during cutting at the periphery of the opening region can be reduced.

Figure 4:
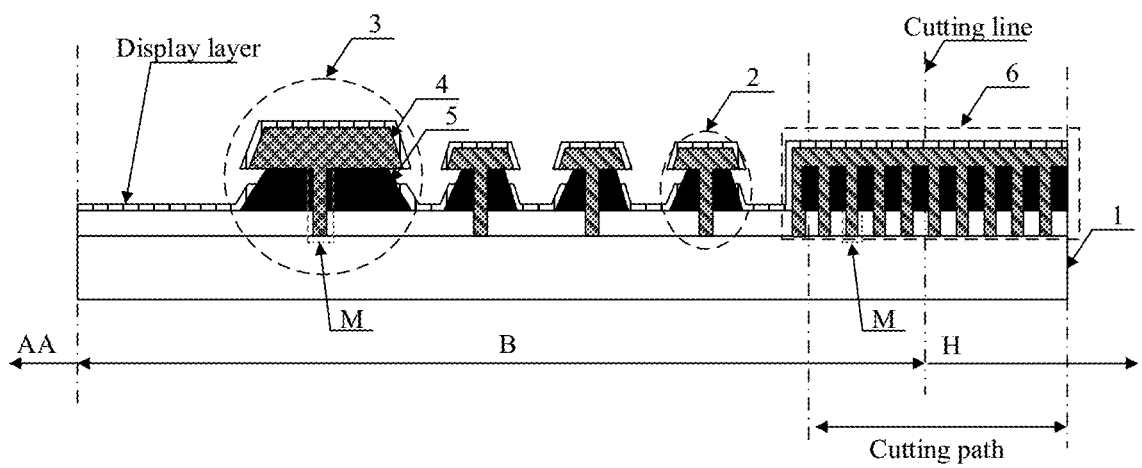
FIG. 4 shows a longitudinal section view of a barrier region before cutting of an opening region in another display panel according to an embodiment of the present disclosure.

FIG. 4 is a longitudinal section view of a barrier region before cutting of an opening region in another display panel according to an embodiment of the present disclosure. A barrier region B of the display panel further includes:

a support structure 6 that is located in the barrier region B and surrounds an opening region H, wherein crack blocking structures 2 surround the support structure 6.

The support structure 6 includes a first organic layer 4 and a film layer between the first organic layer 4 and a base substrate 1. In a direction from the opening region H to a display region AA, a plurality of deep grooves M are arranged at intervals in the support structure 6, and the first organic layer 4 is connected to the base substrate 1 by the deep grooves M. The film layer between the first organic layer 4 and the base substrate 1 includes a first metal layer 5, etc.

Before the opening region H is cut, a part of the cutting path is within the barrier region B, another part of the cutting path is within the opening region H, and the support structure 6 is arranged in the cutting path and surrounds the center of the opening region H. After the opening region H is cut, the support structure 6 in the barrier region B surrounds the opening region H.

By providing a metal layer in the support structure 6, and providing a plurality of deep grooves M surrounding the opening region H at intervals, each deep groove M penetrates through the film layer between the first organic layer 4 and the base substrate 1 such that the first organic layer 4 is connected to the base substrate 1 through the deep groove M, thereby improving the strength of the film layer around the opening region H to prevent cracks from diffusing towards the display region AA when cut, and meanwhile enabling firm connection between the support structure 6 and the base substrate 1 to prevent the film layer from falling off.

Figure 5:
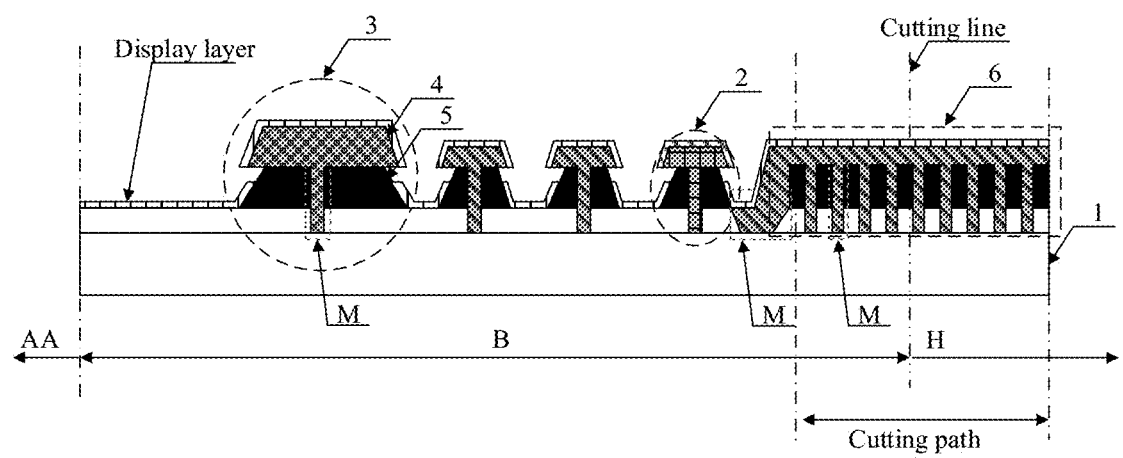
FIG. 5 shows a longitudinal section view of a barrier region before cutting of an opening region in another display panel according to an embodiment of the present disclosure.

FIG. 5 is a longitudinal section view of a barrier region before cutting of a opening region in another display panel according to an embodiment of the present disclosure. A region between the support structure 6 and the crack blocking structure 2 is provided with a deep groove M surrounding the support structure 6, and the first organic layer 4 in the support structure 6 fills the deep groove M between the support structure 6 and the crack blocking structure 2 and is connected to the base substrate 1.

The deep groove M surrounding the support structure 6 is formed in the region between the support structure 6 and the crack blocking structure 2, and is filled with the first organic layer 4 in the support structure 6, and further the first organic layer 4 is connected to the base substrate 1, so that the connection of all the film layers between the first organic layer 4 and the base substrate 1 in the support structure 6 and the crack blocking structure 2 can be completely blocked, preventing cracks formed during cutting from spreading to the crack blocking structure 2.

Figure 6:
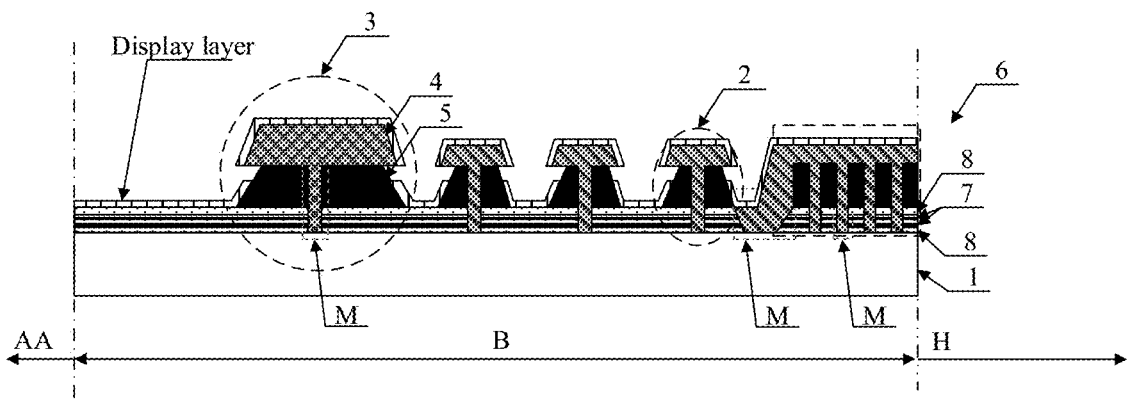
FIG. 6 shows a longitudinal section view of a barrier region in another display panel according to an embodiment of the present disclosure.

Referring to FIG. 6 that is a longitudinal section view of a barrier region in another display panel according to an embodiment of the present disclosure, the display panel further includes:

a plurality of second metal layers 7 and inorganic layers 8 alternately stacked between the base substrate 1 and the first metal layer 5 at the barrier region B.

The deep groove M penetrates through the film layer between the first organic layer 4 and the base substrate 1.

A display of the display panel includes a thin film transistor pixel circuit and an electroluminescent device electrically connected to the thin film transistor pixel circuit.

The thin film transistor pixel circuit includes: an active layer, a first gate insulating layer, a first gate layer, a second gate insulating layer, a second gate layer, an interlayer insulating layer, and a source-drain layer arranged in stack, and further includes a planarization layer on the source-drain layer.

The electroluminescent device is located on the planarization layer, and particularly includes: an anode, a light-emitting functional layer located on the anode, and a cathode located on the light-emitting functional layer. The display panel further includes a pixel definition layer that is located on the planarization layer and configured to divide sub-pixels, and a support layer located on a part of the pixel definition layer.

In some embodiments, the first gate layer, for example, includes a gate of a thin film transistor and a first electrode of a capacitor, and the second gate layer, for example, includes a second electrode of the capacitor. The source-drain layer includes a source and a drain of the thin film transistor. The source-drain layer is electrically connected to the active layer, and the anode is electrically connected to the source-drain layer.

The film layer between the first organic layer 4 and the base substrate 1 is arranged at the same layer as a film layer in the thin film transistor pixel circuit. The first metal layer 5 is arranged at the same layer as the source-drain layer in the thin film transistor pixel circuit. The second metal layers 7 are arranged at the same layer as the first gate layer and the second gate layer in the thin film transistor pixel circuit. The inorganic layers 8 are arranged at the same layer as the first gate insulating layer, the second gate insulating layer and the interlayer insulating layer in the thin film transistor pixel circuit.

In an embodiment provided by the present disclosure, by providing the film layer between the first metal layer 5 and the base substrate 1 as the plurality of second metal layers 7 and inorganic layers 8 alternately stacked, the second metal layers 7 can be formed simultaneously when the first gate layer and the second gate layer of the thin film transistor pixel circuit are formed, and the inorganic layers 8 can be formed simultaneously when the first gate insulating layer, the second gate insulating layer and the interlayer insulating layer of the thin film transistor pixel circuit are formed, thereby further improving the strength of the barrier region B by using existing processes.

Figure 7:
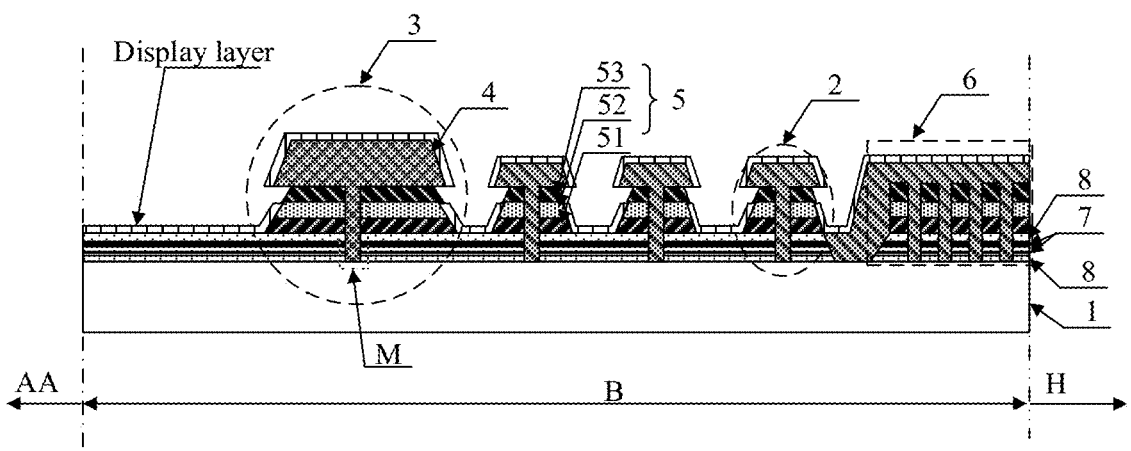
FIG. 7 shows a longitudinal section view of a barrier region in another display panel according to an embodiment of the present disclosure.

Referring now to FIG. 7 that is a longitudinal section view of a barrier region in another display panel according to an embodiment of the present disclosure, the first metal layer 5 includes a first sub-metal layer 51, a second sub-metal layer 52 and a third sub-metal layer 53. The first sub-metal layer 51 is located on a side of the first organic layer 4 proximal to the base substrate 1, the second sub-metal layer 52 is located on a side of the first sub-metal layer 51 away from the base substrate 1, and the third sub-metal layer 53 is located on a side of the second sub-metal layer 52 away from the base substrate 1.

Longitudinal sections of the first sub-metal layer 51, the second sub-metal layer 52, and the third sub-metal layer 53 are patterned as trapezoids.

In the barrier wall 3 and the crack blocking structure 2, edges of the second sub-metal layer 52 are indented relative to edges of the first sub-metal layer 51 and the third sub-metal layer 53.

By indenting the edges of the second sub-metal layer 52 relative to the edges of the first sub-metal layer 51 and the third sub-metal layer 53 in the barrier wall 3 and the crack blocking structure 2, the cathode in the electroluminescent device can be further blocked, which prevents the cathode potential in the electroluminescent device from being transferred to the opening region H, thereby avoiding forming black spots due to electrochemical corrosion.

Figure 8:
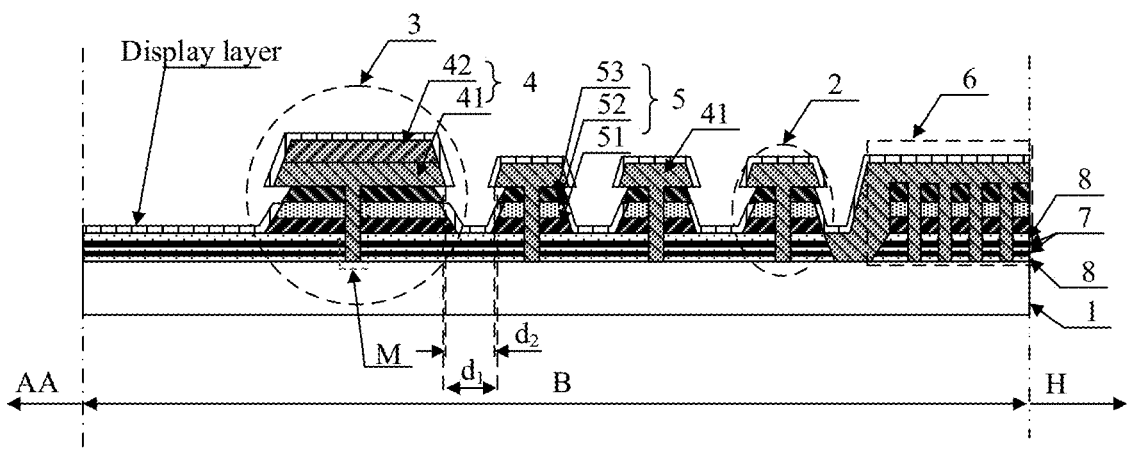
FIG. 8 shows a longitudinal section view of a barrier region in another display panel according to an embodiment of the present disclosure.

Referring to FIG. 8 that is a longitudinal section view of a barrier region in another display panel according to an embodiment of the present disclosure, the first organic layer 4 in the barrier wall 3 includes a first sub-organic layer 41 and a second sub-organic layer 42 arranged in stack.

The first organic layer 4 located in each of the crack blocking structure 2 and the support structure 6 includes a first sub-organic layer 41.

The first sub-organic layer 41 is connected to the base substrate 1 through a deep groove M.

A distance between a lower edge of the third sub-metal layer 53 in the barrier wall 3 and a lower edge of the third sub-metal layer 53 in the crack blocking structure 2 is $d_1$, and a distance between a lower edge of the first sub-organic layer 41 in the barrier wall 3 and a lower edge of the first sub-organic layer 41 in the crack blocking structure 2 is $d_2$, wherein the value of $d_1$-$d_2$ is in a range 1~2 um.

The first sub-organic layer 41 is arranged at the same layer as the planarization layer, and the second sub-organic layer 42 is arranged at the same layer as the pixel definition layer. The first sub-organic layer 41 covers the first metal layer 5, and is connected to the base substrate 1 by the deep groove M, so that the barrier wall 3, the crack blocking structure 2 and the support structure 6 can be firmly fixed to the base substrate 1, thereby preventing the film layer from peeling off.

Figure 9:
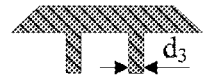
FIG. 9 shows a schematic diagram of a longitudinal section of a first sub-organic layer according to an embodiment of the present disclosure.

Referring to FIG. 9. FIG. 9 is a schematic diagram of a longitudinal section of a first sub-organic layer according to an embodiment of the present disclosure. The longitudinal section of the first sub-organic layer 41 is in a shape of a spur rack, one tooth in the spur rack corresponding to one deep groove M. The spur rack may have one tooth or a plurality of teeth, and the specific quantity of tooth may be adjusted according to the accuracy of the equipment process and the respective widths of the barrier wall 3, the crack blocking structure 2, and the support structure 6, which is not limited herein.

Figure 10:
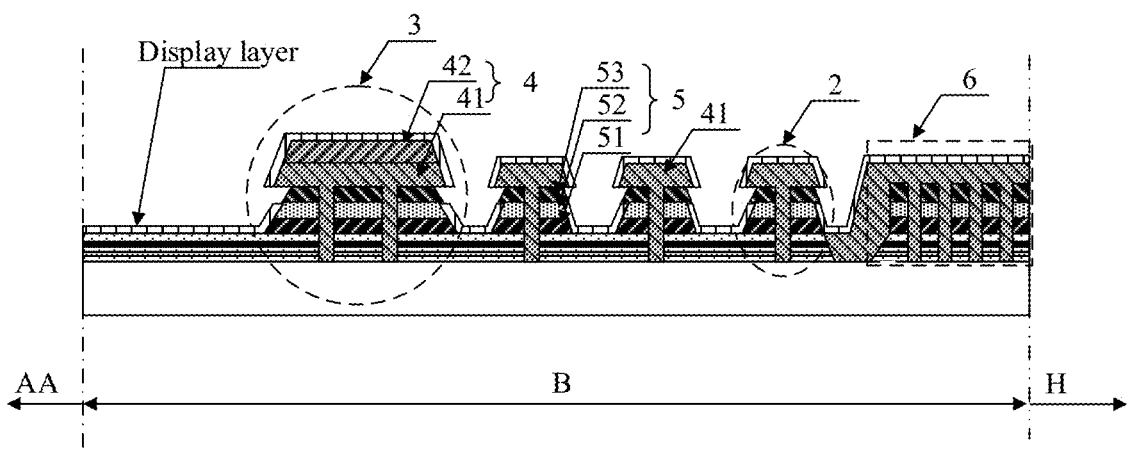
FIG. 10 shows a longitudinal section view of a barrier region in another display panel according to an embodiment of the present disclosure.

For example, the barrier wall 3 is wider, and thus the longitudinal section of the first sub-organic layer 41 in the barrier wall 3 can be in the shape of a spur rack with 2 teeth. The crack blocking structure 2 is narrower, and thus the longitudinal section of the first sub-organic layer 41 in the crack blocking structure 2 can be in the shape of a spur rack with 1 tooth. The support structure 6 is widest, and thus the longitudinal section of the first sub-organic layer 41 in the support structure 6 can be in the shape of a spur rack with 3 or more teeth. As shown in FIG. 10. FIG. 10 is a longitudinal section view of a barrier region in another display panel according to an embodiment of the present disclosure.

As shown in FIG. 9, a single tooth in the spur rack has a width of 4~5 um, and the corresponding deep groove M also has a width of 4~5 um. By configuring the longitudinal section of the first sub-organic layer 41 to be in the shape of a spur rack, the barrier wall 3, the crack blocking structure 2 and the support structure 6 can be firmly fixed to the base substrate 1, thereby preventing the film layer from peeling off.

In some embodiments, the deep groove M includes a groove wall and a groove bottom, wherein the groove wall is composed of a film layer extending between the first sub-organic layer 41 and the base substrate 1 and at least one film layer in the base substrate 1, and the groove bottom is located at a film layer in the at least one film layer furthest from the first metal layer 5.

As shown in FIG. 10, when the groove bottom of the deep groove M is at the surface of the base substrate 1, the groove wall of the deep groove M penetrates through the film layer between the first sub-organic layer 41 and the base substrate 1.

Figure 11:
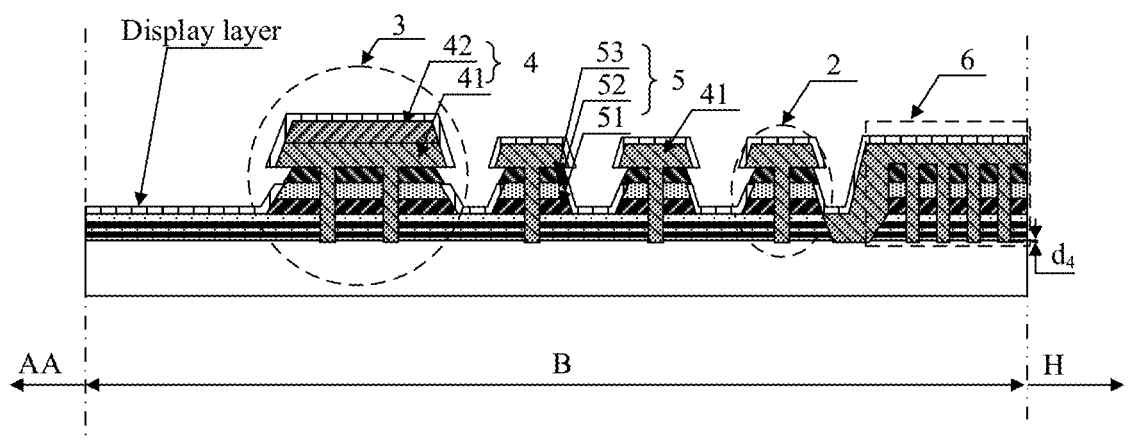
FIG. 11 shows a longitudinal section view of a barrier region in another display panel according to an embodiment of the present disclosure.

In some embodiments, the base substrate 1 may be composed of a plurality of film layers arranged in stack, such as polyimide-blocking layer-polyimide. When the groove bottom of the deep groove M is within the base substrate 1, for example, at the top film layer of the base substrate 1 closest to the first organic layer 4, the groove wall of the deep groove M penetrates through the film layer between the first organic layer 4 and the base substrate 1, and the top film layer of the base substrate 1, wherein the thickness of the deep groove extending into the base substrate 1 is $d_4$ which may be 2 um, as shown in FIG. 11 which is a longitudinal section view of a barrier region in another display panel according to an embodiment of the present disclosure.

In some embodiments, the first organic layer 4 may also employ the same material as the film layer at which the groove bottom of the deep groove M is located, for example, the film layer at which the groove bottom of the deep groove M is located is the top film layer of the base substrate 1. The top film layer employs polyimide, and the first sub-organic layer 41 also employs polyimide. Therefore, the connection of the first sub organic layer 41 to the base substrate 1 can be firmer.

Figure 12:
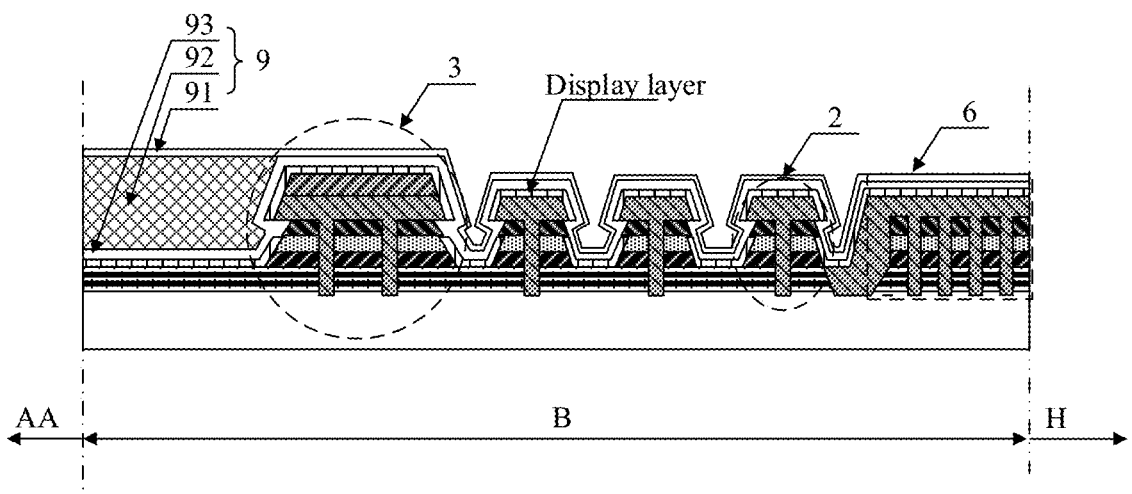
FIG. 12 shows a longitudinal section view of a barrier region in another display panel according to an embodiment of the present disclosure.

Referring to FIG. 12. FIG. 12 is a longitudinal section view of a barrier region in another display panel according to an embodiment of the present disclosure. The display panel further includes an encapsulation layer 9 covering the display region AA and the barrier region B. The encapsulation layer 9 includes a first inorganic encapsulation layer 91, an organic encapsulation layer 92 and a second inorganic encapsulation layer 93. The first inorganic encapsulation layer 91 is located on a side of the first organic layer 4 away from the base substrate 1. The organic encapsulation layer 92 is located on a side of the first inorganic encapsulation layer 91 close to the base substrate 1. The second inorganic encapsulation layer 93 is located on a side of the organic encapsulation layer 92 close to the base substrate 1.

The first inorganic encapsulation layer 91 and the second inorganic encapsulation layer 93 extend from the display region AA to the opening region H. and the organic encapsulation layer 92 is blocked by the barrier wall 3.

In an embodiment provided by the present disclosure, by eliminating the blocking structure on the organic encapsulation layer 92 side in the related art, it is possible to save more space, and widen the barrier wall 3 and the crack blocking structure 2, thereby providing the deep grooves M required in the barrier wall 3 and the crack blocking structure 2.

Figure 13:
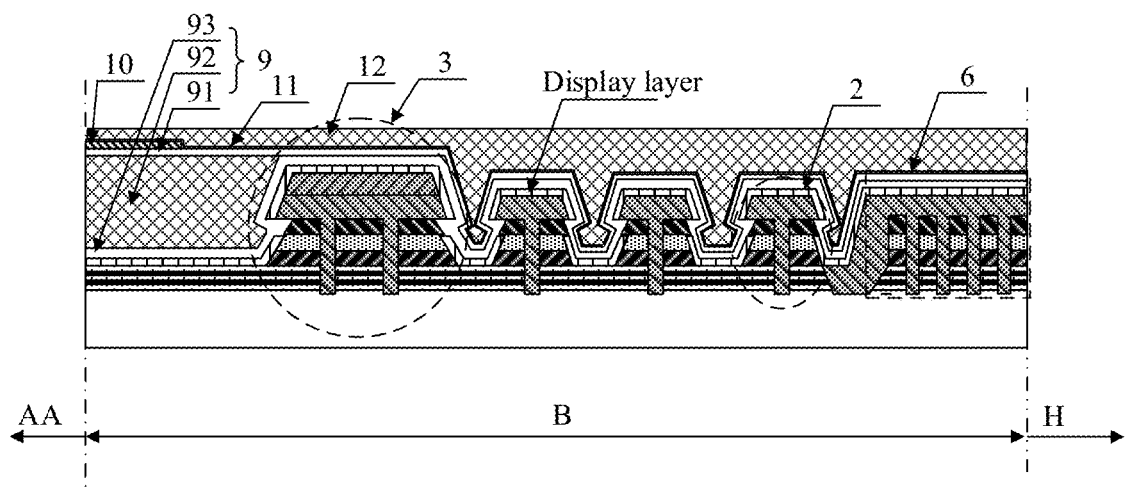
FIG. 13 shows a longitudinal section view of a barrier region in another display panel according to an embodiment of the present disclosure.

Referring to FIG. 13. FIG. 13 is a longitudinal section view of a barrier region in another display panel according to an embodiment of the present disclosure. The barrier region B of the display panel further includes a metal light-shielding layer 10 that surrounds the barrier wall 3, and is located on a side surface of the encapsulation layer 9 away from the base substrate 1.

The display panel further includes:
a touch inorganic layer 11, covering the display region AA and a non-display region and being located on a side of the metal light-shielding layer 10 away from the base substrate 1; and
a touch protective layer 12, covering the touch inorganic layer 11, at least a part of the touch protective layer 12 in the barrier region B being prepared from a mixed solution composed of graphene and a nonpolar solvent, and electrically connected to a ground potential.

In some embodiments, the touch protective layer 12 in the barrier region B can be prepared from a mixed solution composed of graphene and a nonpolar solvent, and is electrically connected to the ground potential. Since graphene has better electrical conductivity, a mixed solution vegetative cover formed by graphene and the nonpolar solvent is the touch protective layer 12 and is electrically connected to the ground potential, so that complete electrostatic dissipation can be achieved at the edge of the opening region H, which improves the problem of greenish at low gray level at the edge of the opening region H.

In other embodiments, the touch protective layer 12 in the display region AA and the barrier region B can be easily prepared from a mixture of graphene and a nonpolar solvent, and is electrically connected to the ground potential. Since graphene has good electrical conductivity, and graphene and the nonpolar solvent have good transmissivity, the touch protective layer 12 of the display region AA and the barrier region B can be formed from a mixed solution composed of graphene and the nonpolar solvent, and meanwhile is electrically connected to the ground potential, which enables electrostatic dissipation across the touch surface of the display panel, and further improves the problem of greenish at low gray level at the edge of the opening region H.

Figure 14:
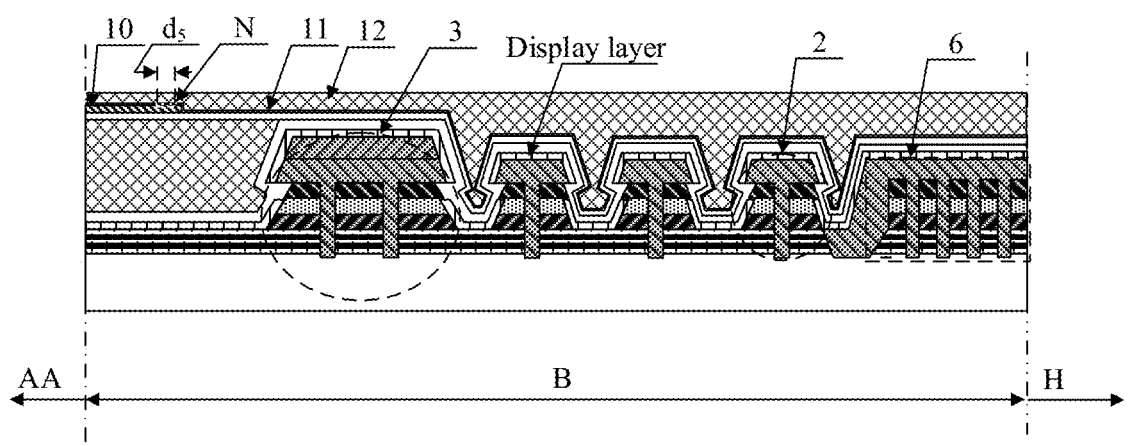
FIG. 14 shows a longitudinal section view of a barrier region in another display panel according to an embodiment of the present disclosure.
Figure 15:
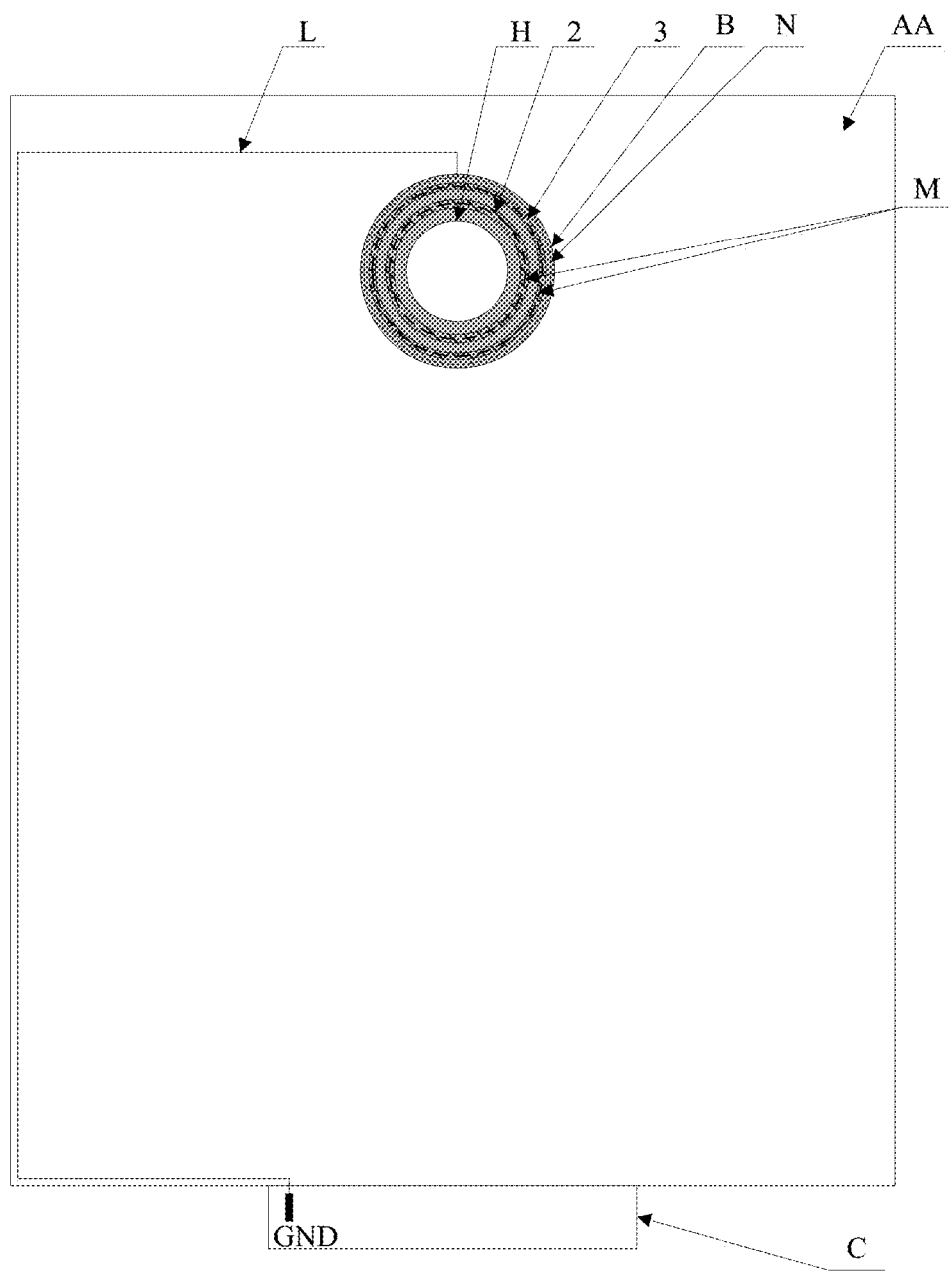
FIG. 15 shows a top view of another display panel according to an embodiment of the present disclosure.

Referring to FIG. 14 and FIG. 15. FIG. 14 is a longitudinal section view of a barrier region in another display panel according to an embodiment of the present disclosure, and FIG. 15 is a top view of another display panel according to an embodiment of the present disclosure. The touch inorganic layer 11 is provided with an open slot N that surrounds the barrier wall 3 and penetrates through the touch inorganic layer 11. The touch protective layer 12 fills the open slot N. The width of the open slot N is $d_5$, and the value of $d_5$ is a range of 5~7 um.

A binding region C is arranged on a side of the display region AA, and the display panel further includes a metal lead L electrically connecting the metal light-shielding layer 10 to a ground terminal GND in the binding region C.

The open slot N surrounding the barrier wall 3 and penetrating through the touch inorganic layer 11 is arranged in the touch inorganic layer 11, and is filled with the touch protective layer 12 prepared from the mixed solution composed of graphene and the nonpolar solution, so that the touch protective layer 12 can be electrically connected to the metal light-shielding layer 10. Since the metal light-shielding layer 10 is electrically connected to a ground terminal GND in the binding region C of the display panel by the metal lead L, the touch protective layer 12 can be electrically connected to the ground potential using the metal light-shielding layer 10 and the metal lead L, so that electrostatic dissipation can be achieved without adding process flows, thereby effectively saving process and cost.

It should be understood that the electrical conductivity of the touch protective layer 12 prepared from the mixed solution composed of graphene and the nonpolar solvent is negligible with respect to the conductivity of the metal material, but is sufficient for electrostatic dissipation, so that the electrical conductivity of the above touch protective layer 12 should not be equivalent to the electrical conductivity of the metal material.

In some embodiments, the nonpolar solvent includes an acrylate solvent or an epoxy resin solvent.

In some embodiments, a black substance is doped in a mixed solution used in at least a part of the touch protective layer 12 in the barrier region B.

In some embodiments, the black substance includes graphene powder or black pigment.

In an embodiment provided by the present disclosure, by doping the black substance in the touch protective layer 12 in the barrier region B, complete light shielding can be achieved in the barrier region B, that is, complete light shielding can be achieved around the opening region H, so as to avoid light leakage at the edge of the opening region H due to cutting of the edge of the opening region H or fitting offset, etc.

Based on the same inventive concept, an embodiment of the present disclosure provides a display module including:
the display panel as described above; and
a flexible circuit board, being bonded with the binding region in the display panel.

Based on the same inventive concept, an embodiment of the present disclosure provides a display device including: the display module as described above.

The display device may be an OLED display, an OLED display screen, an OLED television or other display devices, or may also be a mobile phone, a tablet, a notebook or other mobile devices.

Although the preferred embodiments of the present disclosure have been described, those skilled in the art may make additional changes and modifications to these embodiments once knowing the basic inventive concept. Therefore, the appended claims are intended to be explained as including the preferred embodiments and all changes and modifications falling within the scope of the present disclosure.

Obviously, those skilled in the art can make various changes and modifications to the present disclosure without departing from the spirit and scope of the present disclosure. Thus, provided that these changes and modifications of the present disclosure fall within the scope of the claims of the present disclosure and equivalent technologies thereof, the present disclosure is also intended to cover these modifications and modifications.

What is claimed is:

1. A display panel comprising an opening region, a barrier region surrounding the opening region, and a display region surrounding the barrier region, wherein the display panel comprises:
a base substrate;
a crack blocking structure on a side of the base substrate in the barrier region and surrounding the opening region;
a barrier wall on a side of the base substrate in the barrier region and surrounding the crack blocking structure; wherein
the barrier wall and the crack blocking structure respectively comprise a first metal layer and a first organic layer on a side away from the base substrate, of the first metal layer, and an edge of the side away from the base substrate, of the first metal layer is indented relative to an edge of a side proximal to the base substrate, of the first organic layer; at least one of the barrier wall and the crack blocking structure is provided with a deep groove penetrating through the first organic layer and the base substrate, and the deep groove surrounds the opening region; and the first organic layer fills the deep groove and is connected to the base substrate.

2. The display panel of claim 1, wherein the barrier region further comprises a support structure that is in the barrier region and surrounds the opening region, and the crack blocking structure surrounds the support structure;
the support structure comprises the first organic layer, and a film layer between the first organic layer and the base substrate; the film layer comprises the first metal layer, and
the support structure is provided with a plurality of deep grooves at intervals in a direction from the opening region to the display region, and the first organic layer is connected to the base substrate by the deep grooves.

3. The display panel of claim 2, wherein the deep grooves surrounding the support structure are formed in a region between the support structure and the crack blocking structure, and the first organic layer in the support structure fills the deep grooves between the support structure and the crack blocking structure and is connected to the base substrate.

4. The display panel of claim 1, further comprises:
a plurality of second metal layers and inorganic layers being alternately stacked between the base substrate and the first metal layer at the barrier region; and
the deep grooves penetrate through a film layer between the first organic layer and the base substrate, the film layer comprises the first metal layer, the second metal layers and the inorganic layers.

5. The display panel of claim 4, wherein the first organic layer in the barrier wall comprises a first sub-organic layer and a second sub-organic layer arranged in stack;
the first organic layer located in each of the crack blocking structure and the support structure comprises the first sub-organic layer; and
the first sub-organic layer is connected to the base substrate by the deep groove.

6. The display panel of claim 5, wherein a longitudinal section of the first sub-organic layer is in a shape of a spur rack, and one tooth in the spur rack corresponds to one deep groove.

7. The display panel of claim 6, wherein the barrier wall is provided with a plurality of the deep grooves.

8. The display panel of claim 4, wherein the deep groove comprises a groove wall and a groove bottom, the groove wall is formed by at least one of the film layer and the base substrate in the base substrate, and the groove bottom is at one of the at least one of the film layer furthest from the first metal layer.

9. The display panel of claim 8, wherein a film layer on which the groove bottom is of a material same as a material of the first sub-organic layer.

10. The display panel of claim 1, wherein the first metal layer comprises a first sub-metal layer, a second sub-metal layer, and a third sub-metal layer arranged in stack; the first sub-metal layer is on a side proximal to the base substrate, of the first organic layer, the second sub-metal layer is on a side away from the base substrate, of the first sub-metal layer, and the third sub-metal layer is on a side away from the base substrate, of the second sub-metal layer;

longitudinal sections of the first sub-metal layer, the second sub-metal layer, and the third sub-metal layer are patterned as trapezoids; and in the barrier wall and the crack blocking structure, edges of the second sub-metal layer are indented relative to edges of the first sub-metal layer and the third sub-metal layer.

11. The display panel of claim 10, further comprises an encapsulation layer covering the display region and the barrier region, and the encapsulation layer comprises a first inorganic encapsulation layer, an organic encapsulation layer, and a second inorganic encapsulation layer; the first inorganic encapsulation layer is on a side away from the base substrate, of the first organic layer, the organic encapsulation layer is on a side proximal to the base substrate, of the first inorganic encapsulation layer, and the second inorganic encapsulation layer is on a side proximal to the base substrate, of the organic encapsulation layer; and the first inorganic encapsulation layer and the second inorganic encapsulation layer extend from the display region to the opening region, and the organic encapsulation layer is blocked by the barrier wall.

12. The display panel of claim 11, wherein the barrier region further comprises a metal light-shielding layer that surrounds the barrier wall, and the metal light-shielding layer is on a side surface away from the base substrate, of the encapsulation layer;

the display panel further comprises:

a touch inorganic layer covering the display region and a non-display region and being on a side away from the base substrate, of the metal light-shielding layer; and a touch protective layer covering the touch inorganic layer, at least a part of the touch protective layer in the barrier region being prepared from a mixed solution comprising graphene and a nonpolar solvent, and being electrically connected to a ground potential.

13. The display panel of claim 12, wherein the touch inorganic layer is provided with an open slot surrounding the barrier wall and penetrating through the touch inorganic layer, and the touch protective layer fills the open slot; and a binding region is arranged on a side of the display region, and the display panel further comprises a metal lead electrically connecting the metal light-shielding layer to a ground terminal in the binding region.

14. The display panel of claim 12, wherein the nonpolar solvent comprises:

an acrylate solvent or an epoxy resin solvent.

15. The display panel of claim 12, wherein a black substance is doped in a mixed solution used in at least a part of the touch protective layer in the barrier region.

16. The display panel of claim 15, wherein the black substance comprises:

graphene powder or black pigment.

17. A display device, comprising a display panel;

wherein the display panel comprises an opening region, a barrier region surrounding the opening region, and a display region surrounding the barrier region, wherein the display panel comprises:

a base substrate;

a crack blocking structure on a side of the base substrate in the barrier region and surrounding the opening region;

a barrier wall on a side of the base substrate in the barrier region and surrounding the crack blocking structure; wherein the barrier wall and the crack blocking structure respectively comprise a first metal layer and a first organic layer on a side away from the base substrate, of the first metal layer, and an edge of the side away from the base substrate, of the first metal layer is indented relative to an edge of a side proximal to the base substrate, of the first organic layer; at least one of the barrier wall and the crack blocking structure is provided with a deep groove penetrating through the first organic layer and the base substrate, and the deep groove surrounds the opening region; and the first organic layer fills the deep groove and is connected to the base substrate.

\* \* \* \* \*